(12) United States Patent
Kang et al.

(10) Patent No.: US 7,375,426 B2
(45) Date of Patent: May 20, 2008

(54) SEMICONDUCTOR PACKAGE

(75) Inventors: Suk-Chae Kang, Gyeonggi-do (KR);
Si-Hoon Lee, Gyeonggi-do (KR);
Sa-Yoon Kang, Seoul (KR); Dong-Han Kim, Gyeonggi-do (KR); Yun-Hyeok Im, Gyeonggi-do (KR); Gu-Sung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 11/173,852

(22) Filed: Jun. 30, 2005

(65) Prior Publication Data
US 2006/0012019 A1    Jan. 19, 2006

(30) Foreign Application Priority Data
Jul. 14, 2004    (KR) ............... 10-2004-0054855

(51) Int. Cl.
*H01L 23/12* (2006.01)
*H01L 23/48* (2006.01)

(52) U.S. Cl. .............. 257/731; 257/773; 257/776; 257/780; 257/784; 257/678; 361/638; 361/640; 361/727; 361/736; 361/749

(58) Field of Classification Search ............ 257/666, 257/668–671, 678–733, 773–776, 780–782, 257/784, 785; 361/296, 638, 640, 667, 727, 361/736, 748, 749; 438/15, 25–28, 51, 55, 438/64–68, 106–127, FOR. 340–FOR. 384
See application file for complete search history.

(56) References Cited

U.S. PATENT DOCUMENTS

| | | | |
|---|---|---|---|
| 4,868,638 A | 9/1989 | Hirata et al. | |
| 5,103,292 A | 4/1992 | Mahulikar | |
| 5,561,323 A * | 10/1996 | Andros et al. | 257/707 |
| 5,583,377 A * | 12/1996 | Higgins, III | 257/707 |
| 6,097,603 A * | 8/2000 | Edwards et al. | 361/719 |
| 6,809,931 B2 * | 10/2004 | Dove et al. | 361/707 |
| 6,906,414 B2 * | 6/2005 | Zhao et al. | 257/707 |
| 2003/0193080 A1 * | 10/2003 | Cabahug et al. | 257/666 |

FOREIGN PATENT DOCUMENTS

| | | |
|---|---|---|
| CN | 1349256 A | 5/2002 |
| KR | 1999-025075 | 4/1999 |
| KR | 2000-19591 | 4/2000 |
| KR | 2002-0089785 | 11/2002 |
| WO | WO 02/50899 A2 | 6/2002 |

OTHER PUBLICATIONS

English language abstract of Korean Publication No. 2002-0089785.

* cited by examiner

*Primary Examiner*—Jasmine Clark
(74) *Attorney, Agent, or Firm*—Marger Johnson & McCollom, P.C.

(57) ABSTRACT

A semiconductor package includes a semiconductor chip, a circuit board at which a wire pattern is formed, and a metal structure including a portion inserted through an opening of the circuit board and upon which the semiconductor chip rests. With the semiconductor chip in direct contact with the metal structure, thermal characteristics improve. With the circuit board supported by the metal structure, mechanical stability improves.

43 Claims, 6 Drawing Sheets $a1 \geq a2, \quad b1 > b2$

SEMICONDUCTOR PACKAGE

CROSS-REFERENCE TO RELATED APPLICATIONS

This U.S. non-provisional patent application claims priority under 35 U.S.C. § 119 of Korean Patent Application 2004-54855 filed on Jul. 14, 2004, the entire contents of which are hereby incorporated by reference.

BACKGROUND OF THE INVENTION

The description relates to assembling technology for semiconductor chips and more particularly, to a semiconductor package with improved mechanical stability and thermal characteristics.

A sheet of wafer usually includes several dozens or several hundreds of chips with electrical circuits printed by a semiconductor manufacturing process. The chips on the wafer cannot operate without an external electric power supply. In addition, the microelectronic circuits are readily damaged by external impacts or surges. A known assembling technology for packaging such chips, e.g., forming a semiconductor package, provides the chips with mechanical stability. In applicable products, the semiconductor package provides electrical connections to the chip for supplies of power and signals shielded by plastic housings against external impacts or surges across various environments.

Generally, semiconductor packages can be classified into resin sealing packages, tape carrier packages (TCP), glass sealing packages, and metal sealing packages, etc. These semiconductor packages are further classified into insertion types and surface mounting types in accordance with mounting methods. Typically employed as the insertion type are a dual in-line package (DIP) and a pin grid array (PGA), etc. Typically employed as the surface mounting type are a quad flat package (QFP), a plastic leaded chip carrier (PLCC), a ceramic leaded chip carrier (CLCC), and a ball grid array (BGA), etc.

In a conventional semiconductor package, a semiconductor chip is positioned on a chip-accommodating space of a circuit board having a structure that has wire patterns and the space capable of mounting the chip thereon and offering the chip electrical connections by means of the wire patterns. The circuit board, on which the semiconductor chip is attached, has been being made of an organic material. The organic material is widely used as the circuit board because its wire pattern can be easily formed with a known process and an inexpensive manufacturing cost as well.

However, since the circuit board is formed of the organic material and in direct contact with the semiconductor chip, thermal characteristics of the semiconductor package degrade. In other words, the organic circuit board may be unable to dissipate a high temperature generated by the semiconductor chip and the circuit board.

Therefore, packages using ceramic materials having improved thermal characteristics have been used. However, forming the wire pattern on the ceramic material requires high manufacturing cost in comparison with forming the wire pattern on the organic material. In addition, the ceramic material lacks sufficient mechanical stability for the semiconductor package since it is sensitive to a high external pressure.

To solve problems concerned with the mechanical stability of the ceramic material, a metal PGA package using a metal circuit board has been proposed. The metal PGA package is disclosed in U.S. Pat. No. 5,103,292, entitled "METAL PIN GRID ARRAY PACKAGE." Insertion holes corresponding to the number of conductive pins for connecting to another external circuit board are formed at a metal plate located under the circuit board, and insulating material is filled into the respective microscopic insertion holes. However, it is difficult to form the many microscopic insertion holes needed to correspond to the number of the conductive pins on the metal plate. As a result, the proposal offered a complicated process and high manufacturing cost.

SUMMARY OF THE INVENTION

The present invention is directed to a semiconductor package having high mechanical stability and low cost.

An aspect of embodiments of the present invention is to provide a semiconductor package including an organic circuit board upon which a wire pattern is easily formed. A metal structure supports the circuit board and receives a semiconductor chip. The metal structure includes a lower metal member, sidewall metal members respectively extending, e.g., vertically upward, from edges of the lower metal member, and an upper metal member extending, e.g., horizontally, from the sidewall metal members to cover a portion of the circuit board. The circuit board has an opening. A projecting structure, formed by the sidewall metal members and the lower metal member of the metal structure, is inserted into the opening and the upper metal member of the metal structure is located on the circuit board.

The upper metal member is located to expose a portion (that is, a bonding region) of the circuit board. The semiconductor chip is electrically connected to the bonding region of the circuit board by appropriate bonding means, for example, wire bonding. Preferably, the upper metal member covers a first portion of the circuit board and exposes a second portion of the circuit board adjacent to a periphery of the opening of the circuit board.

In accordance with embodiments of the semiconductor package of the present invention, the lower metal member of the metal structure is in contact with the semiconductor chip to provide good thermal characteristics. In addition, the upper metal member of the metal structure is in contact with the circuit board and thereby provides excellent mechanical stability.

In addition, the metal structure is located upon the circuit board, e.g., attaches to an upper surface of the circuit board and projects through the opening of the circuit board. This places the circuit board under the metal structure and eliminates the need to form insertion holes through the metal structure, e.g., for the conductive pins to connect to another circuit board. Therefore, a variety of devices may be used to connect to another circuit board, e.g., conductive connecting pins, solder balls, or lands can be readily formed on a circuit pattern made of organic material.

The circuit board is formed of, for example, organic material and the wire pattern can be readily and inexpensively formed thereby decreasing the manufacturing cost of the semiconductor package.

In the semiconductor package, the sidewall metal members are comprised of a plurality of sidewall metal members spaced apart from each other. The upper metal member may be comprised of a plurality of metal members spaced apart from each other, or may be integrally formed. The upper metal member may be formed regardless of shape to cover a portion of the circuit board. The upper metal member leaves exposed a bonding region of the circuit board, e.g., a portion of the circuit board adjacent to the opening of the circuit board. Thus, the upper metal member may have a shape capable of entirely or partially covering the remaining portion, or non-bonding region, of the circuit board.

For example, when the upper metal member is comprised of a plurality of metal members spaced apart from each other, a portion of the circuit board between the metal members is exposed. This can include a portion of the circuit board adjacent to the opening of the circuit board. When the upper metal member is integrally formed, the metal member may have a size larger than that of the opening of the circuit board and have a ring or frame shape for defining a similarly shaped opening. In this manner, a portion of the circuit board is exposed along a periphery of the opening of the circuit board to facilitate the bonding region.

Preferably, the lower metal member has the same shape as the semiconductor chip, e.g., a rectangular shape, to receive the semiconductor chip. Similarly, preferably, the opening of the circuit board, through which the lower metal member is inserted, also has a rectangular shape. If the upper metal member is integrally formed, the upper metal member may have a rectangular frame shape for defining a rectangular opening therein.

The spaced sidewall metal members can extend from opposite sides of the rectangular opening in the upper metal member toward and connect to opposite sides of the rectangular shaped lower metal member. For example, the spaced sidewall metal members may be comprised of two sidewall metal members spaced apart from each other.

The spaced sidewall metal members may extend from opposite two or four corners of the rectangular shaped opening of the rectangular frame shaped upper metal member toward and connect to opposite two or four corners of the rectangular shaped lower metal member. For example, the spaced sidewall metal members may be comprised of opposite two or four sidewall metal members spaced apart from each other.

The upper metal member may be comprised of spaced upper metal members. For example, when the spaced sidewall metal members are comprised of two sidewall metal members spaced apart from each other, the upper metal member may be also comprised of two spaced upper metal members, each connected to one of the two spaced sidewall metal members. Similarly, when the spaced sidewall metal members are comprised of spaced four sidewall metal members, the upper metal member may also comprised of four spaced upper metal members each connected to one of the four sidewall metal members.

Conductive pins, solder balls, or lands are connected to a wire pattern formed at a surface portion of the circuit board in not contact with the upper metal member, e.g., at the bottom surface of the circuit board, and are electrically connectable to another circuit board.

A thermal radiation member may be additionally attached to the lower metal member to improve thermal radiation characteristics of the semiconductor package.

In addition, to obtain desired electrical characteristics for a high-speed device, a decoupling capacitor may be additionally formed at the bottom surface of the circuit board.

Further, the semiconductor package according to embodiments of the present invention further includes a hermetic insulating member. The hermetic insulating member protects the circuit board and the semiconductor chip. The hermetic insulating member need not cover a surface of the semiconductor chip. In this case, the semiconductor chip can include, for example, a plurality of mirrors on its surface and corresponding to a digital micro-mirror device (DMD). The DMD is used in digital light processing (DLP) technology of image forming using a mirror reflection theory. An appropriate adhesive agent attaches a transparent capping layer to the semiconductor chip to protect the mirrors.

Another aspect of embodiments of the present invention is to provide a semiconductor package including a circuit board having an opening, at which a wire pattern is formed, with a metal structure in contact with the circuit board and bearing a semiconductor chip. The metal structure includes an upper metal member covering the circuit board while exposing a bonding region of the circuit board adjacent to the opening. A lower metal member of the metal structure sits in or in relation to the opening and carries the semiconductor chip. A sidewall metal member extends, e.g., vertically upward, from the lower metal member to pass through the opening and connect to a periphery of the upper metal member. The semiconductor chip is electrically connected to the wire pattern of the bonding region of the circuit board, e.g., through wire bonding.

Still another aspect of embodiments of the present invention is to provide a semiconductor package including a rectangular circuit board and a rectangular shaped opening at its center with a wire pattern is formed thereabout. A metal structure including a ring or frame shaped upper metal member is attached to the circuit board while exposing a bonding region of the circuit board adjacent to the opening. A rectangular lower metal member, at which the semiconductor chip attaches, sits in or in relation to the opening. A sidewall connecting member connects together an inner side of the upper metal member and a periphery of the lower metal member. The semiconductor chip and the bonding region of the circuit board are electrically connected to each other, e.g., through wire bonding.

BRIEF DESCRIPTION OF THE DRAWINGS

The accompanying drawings are included to provide a further understanding of embodiments of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
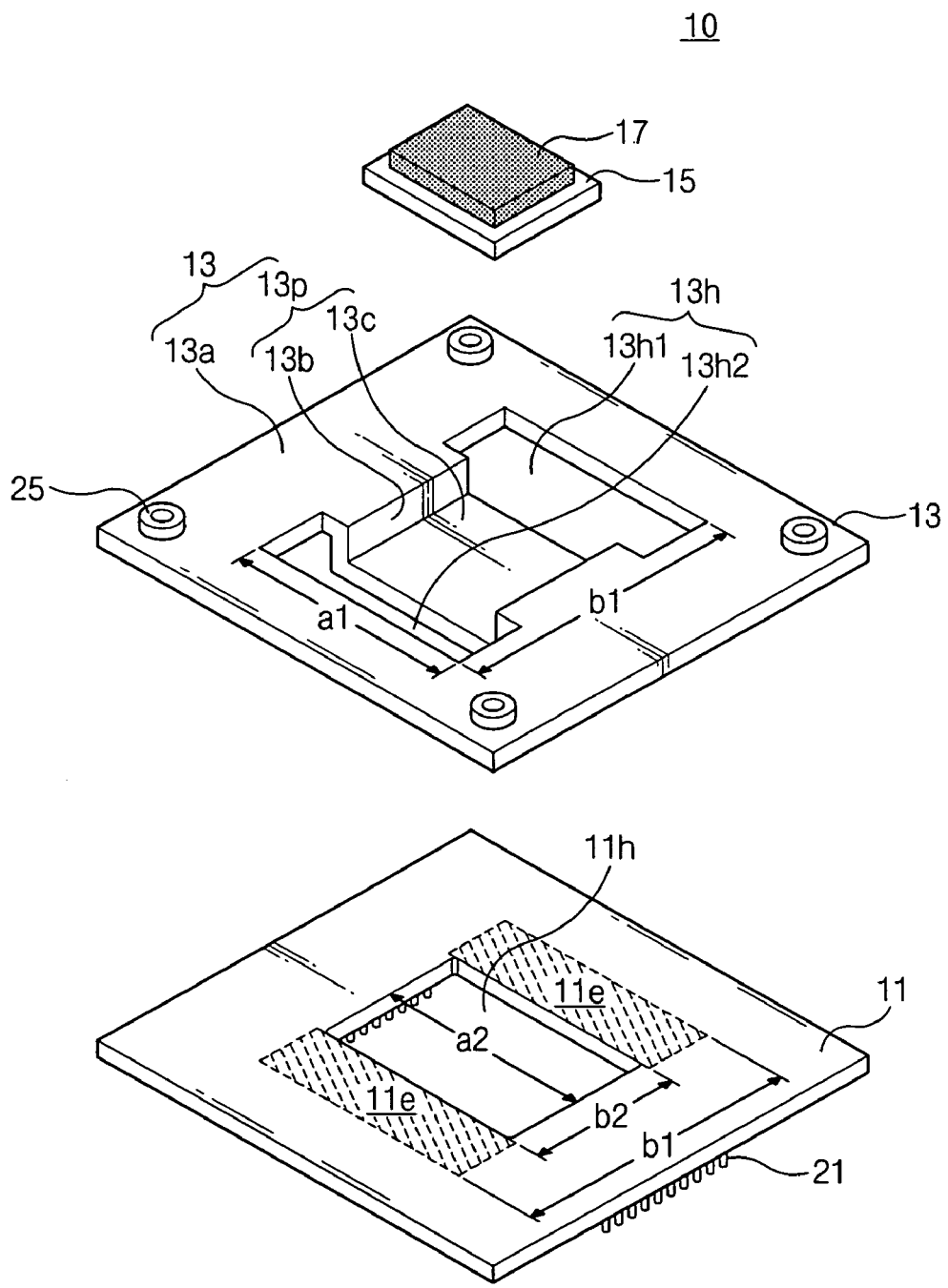
FIG. 1 is an exploded perspective view of a semiconductor package in accordance with a first exemplary embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

In the drawings, components or members constituting the semiconductor package are exaggerated for clarity. In addition, terms such as first, second and third are used to describe various openings in various embodiments herein below, but these openings are not limited by the terms. Further, the terms are used to merely differentiate any opening from another opening. Therefore, the opening referred to as a first opening in an embodiment may be described as a second opening in another embodiment.

Hereinafter, an exemplary embodiment of the present invention will be described in conjunction with the accompanying drawings. The present invention relates to semiconductor packages generally, and it will be apparent to those skilled in the art that a DMD package will be described as an example, and that the present invention is applicable to semiconductor packages without limitation to the DMD package.

Embodiment 1

Figure 2:
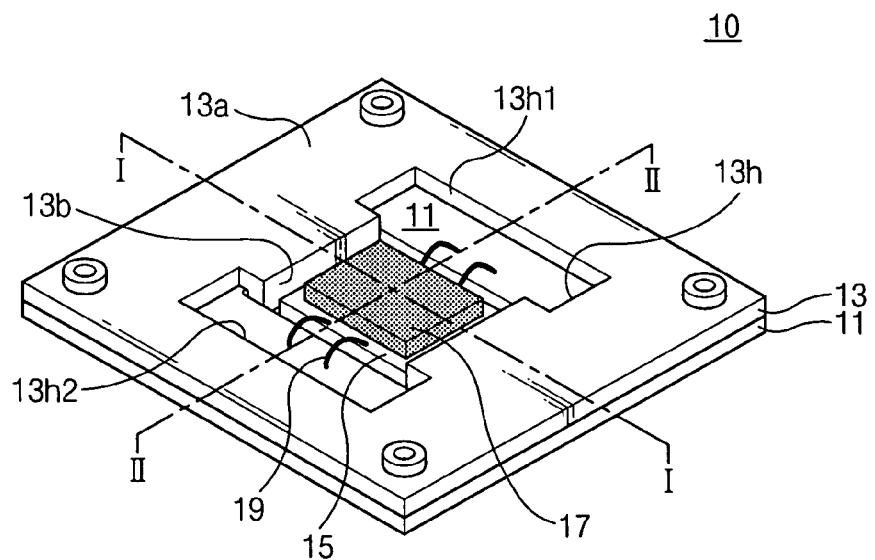
FIGS. 2 and 3 are schematic perspective views illustrating the semiconductor package in FIG. 1 as assembled.
Figure 3:
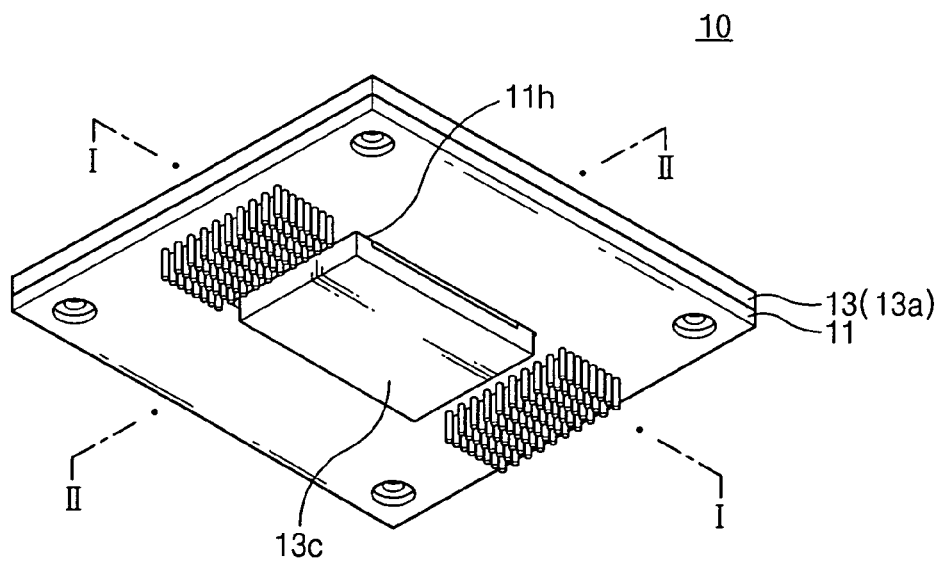
Figure 4:
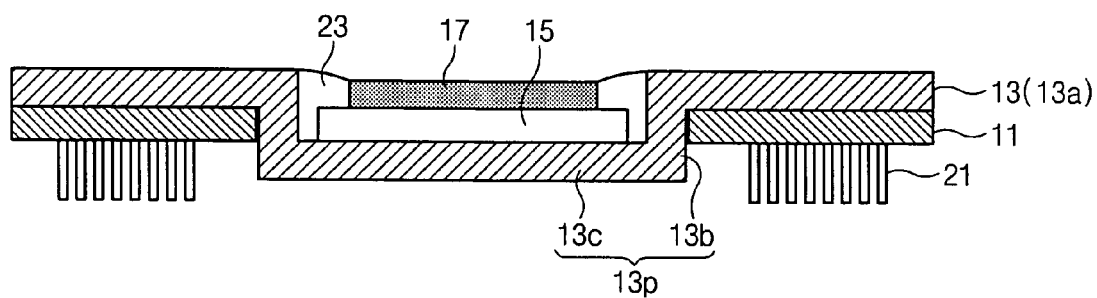
FIGS. 4 and 5 are schematic cross-sectional views of the semiconductor package taken along the line I-I and II-II in FIGS. 2 and 3.
Figure 5:
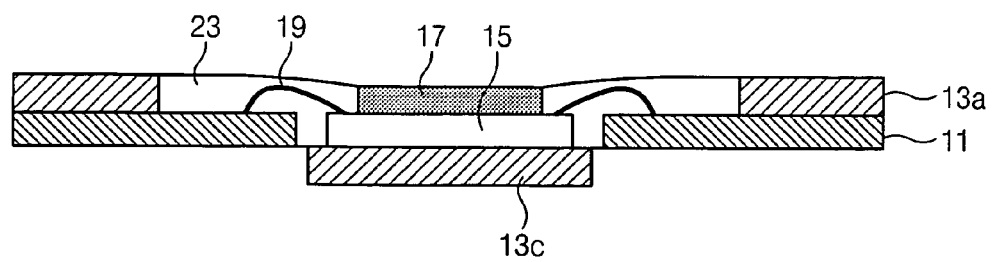

FIG. 1 is an exploded perspective view of a semiconductor package in accordance with a first exemplary embodiment of the present invention. FIGS. 2 and 3 are schematic perspective views illustrating the semiconductor package of FIG. 1 as assembled. FIGS. 4 and 5 are schematic cross-sectional views of the semiconductor package as taken along the lines I-I and II-II in FIGS. 2 and 3.

In FIG. 1, a semiconductor package 10 in accordance with a first embodiment of the present invention includes a semiconductor chip 15, a circuit board 11 on which a wire pattern (not shown) is formed, and a metal structure 13 mechanically supporting the circuit board 11 and bearing the semiconductor chip 15. A plurality of mirrors 17 may be additionally attached on the semiconductor chip 15, e.g., as adapted to DLP technology as a DMD. In addition, in application of the DMD, datums 25 are formed at corners of the metal structure 13 to adjust a distance between a lens and the mirrors 17.

The circuit board 11 is formed of organic material, and a wire pattern can be readily formed at an inexpensive manufacturing cost. The wire pattern can be formed at both sides (the top surface and the bottom surface) of the circuit board 11. The wire pattern formed at the circuit board 11 is appropriate in consideration of the kind and of the field of application of the semiconductor chip. Formation of the wire pattern is well known to those skilled in the art and a detailed description will be omitted.

The circuit board 11 is provided with a first opening 11$h$, e.g., at its center. Preferably, the circuit board 11 has a rectangular shape and the first opening 11$h$ has also a rectangular shape. In this embodiment, the circuit board 11 has a rectangular frame shape. That is, the periphery of the circuit board 11 has a rectangular shape and the first opening has a rectangular shape at center of the circuit board 11. However, various shapes of the circuit board 11 and the first opening 11$h$ may be used. For example, the periphery of the circuit board 11 and the shape of the first opening 11$h$ may have a different shape relative to each other.

The metal structure 13 includes a projection 13$p$ inserted into the first opening 11$h$ of the circuit board 11. An upper horizontal metal member 13$a$ connects to the projection 13$p$ and attaches to the circuit board 11 to provide mechanical stability to the circuit board 11. Preferably, the upper horizontal metal member 13$a$ of the metal structure 13 has a rectangular shape and has a second opening 13$h$ with a rectangular shape. In this embodiment, the upper horizontal metal member 13$a$, having a rectangular frame shape, has a rectangular shaped opening larger than that of the circuit board 11. The second opening 13$h$ of the upper horizontal metal member 13 is bigger than the first opening 11$h$ of the circuit board 11 (a1$\geq$a2, and b1$\geq$b2). The projection 13$p$ of the metal structure 13 includes sidewall metal members 13$b$ vertically extending from opposite sides of the second opening 13$h$ of the upper horizontal metal member 13$a$. The projection 13$p$ also includes a rectangular shaped lower horizontal metal member 13$c$ horizontally extending from the sidewall metal members 13$b$. That is, the two sidewall metal members 13$b$ connect together parts of the opposite two sides of the second opening 13$h$ of the rectangular frame shaped upper horizontal metal member 13$a$ with opposite two sides of the rectangular shaped lower horizontal metal member 13$c$. Therefore, the lower horizontal metal member 13$c$, having a size smaller than that of the second opening 13$h$, is located in relation to the second opening 13$h$ of the upper horizontal metal member 13$a$. A third opening 13$h$1 and a fourth opening 13$h$2 are defined at both sides of the lower horizontal metal member 13$c$. The semiconductor chip 15 attaches on the lower horizontal metal member 13$c$ of the projection 13$p$.

When the projection 13$p$ of the metal structure 13 is inserted into the first opening 11$h$ of the circuit board 11 and the upper horizontal metal member 13$a$ of the metal structure 13 attaches to the top surface of the circuit board 11, regions 11$e$ remain exposed. More particularly, as in the illustrated embodiment, regions 11$e$ (shown as dotted oblique lines and herein referred to as "bonding regions") at the top surface of the circuit board 11 and adjacent to the opposite two sides of the first opening 11$h$ are exposed by the third and fourth openings 13$h$1 and 13$h$2 of the metal structure 13. A wire pattern, formed at the bonding regions 11$e$ of the circuit board, and the semiconductor chip 15 are connected to each other through known wire bonding and like methods. In addition, conductive structures for connecting to another circuit board, for example, connecting pins 21, solder balls, lands or the like may be formed on the circuit board 11.

Hereinafter, a process of manufacturing a semiconductor package in accordance with a first embodiment of the present invention will be described in conjunction with FIGS. 1 to 5. A semiconductor chip 15 is appropriately manufactured depending upon its field of application. As shown in FIG. 1, a circuit board 11 and a metal structure 13 are prepared. The metal structure 13 may be manufactured through a well-known process such as a molding process. The semiconductor chip 15, at which mirrors 17 are attached in this particular application, is attached on a lower horizontal metal member 13$c$ of the metal structure 13 using an appropriate adhesive agent. Various structures may be attached on the semiconductor chip 15 depending upon fields of application. A projection 13$p$ of the metal structure 13 is inserted into a first opening 11$h$ of the circuit board 11, and an upper horizontal metal member 13$a$ of the metal structure 13 is attached on the top surface of the circuit board 11 using an appropriate adhesive agent. The semiconductor chip 15 and the exposed bonding regions 11$e$ of the top surface of the circuit board 11 are electrically connected to each other by bonding wires 19. The bonding wires 19 couple the semiconductor chip 15 and the bonding regions 11$e$ as exposed adjacent to the first opening 11$h$ of the circuit board 11. An epoxy molding process is performed to form a hermetic insulating member 23 for protecting the circuit board 11 and the semiconductor chip 15. In this process, e.g., in the case of a DMD package, the epoxy molding process avoids coverage of the mirrors 17 attached on the semiconductor chip 15. In addition, a transparent capping layer (not shown) may be attached to protect the mirrors 17. On the other hand, when an additional structure is not attached on the semiconductor chip 15, e.g., no mirrors 17 at a given surface, the semiconductor chip 15 can be fully protected, e.g., the epoxy molding process can cover more fully the given surface of the semiconductor chip 15. Conductive structures such as connecting pins 21 for electrically connecting the circuit board 11 to another circuit board (not shown) are formed at the bottom surface of the circuit board 11. While the conductive pins 21 are shown in the drawings, it will be understood that a variety of conductive elements, e.g., solder balls or lands, may be used instead of the conductive pins 21.

In accordance with a semiconductor package 10 of a first embodiment of the present invention, as shown in FIGS. 3 and 4, the upper horizontal metal member 13a of the metal structure 13 is attached on the circuit board 11. Therefore, mechanical stability of the semiconductor package can be obtained. Meanwhile, as shown in FIGS. 3 and 4, the semiconductor chip 15 is attached on the lower horizontal metal member 13c of the metal structure 13 to improve thermal characteristics of the semiconductor package 10. As opposed to a conventional semiconductor package using a conventional metal plate, in the embodiment of FIGS. 3 and 4 the conductive pins 21 are formed at the bottom surface of the circuit board 11 need not pass through an intervening metal structure.

While not shown, to further improve thermal radiation characteristics of the semiconductor package 10, a thermal radiation member may be additionally attached to the lower horizontal metal member 13c of the metal structure 13. In addition, in order to obtain electrical characteristics of a package for a high-speed device, decoupling capacitors (not shown) may be additionally formed at the bottom surface of the circuit board 11.

As described above, the metal structure 13 of the first embodiment of the present invention may be modified to have various structures, and hereinafter, various embodiments of the present invention will be described, e.g., in conjunction with FIGS. 6 to 8. In the metal structure 13 of the first embodiment, the sidewall metal members 13b connect between the upper and lower horizontal metal members 13a and 13c and are spaced apart from each other while extending from opposite two sides of the rectangular shaped lower horizontal metal member 13c to opposite two sides of the second opening of the upper horizontal metal member 13a. In various embodiments to be described hereinafter, the lower horizontal metal member 13c and the circuit board 11 may maintain their shape as in the first embodiment. Positions and/or the number of the sidewall metal members extending from the lower horizontal metal member as well as shapes of the upper horizontal metal member may vary. Typically, however, the upper horizontal metal member covers a portion of the circuit board, but leaves exposed the bonding region of the circuit board, e.g., adjacent to the first opening. As a result, electrically connecting the semiconductor chip and the circuit board is readily possible, e.g., through wire bonding. The semiconductor chip may be variously manufactured depending upon fields of application and electrical connection to the circuit board also may vary accordingly. In various embodiments of the present invention, the upper horizontal metal member of the metal structure has selected shapes to make selected portions of the circuit board exposed and thereby support various electrical connections.

Embodiment 2

Figure 6:
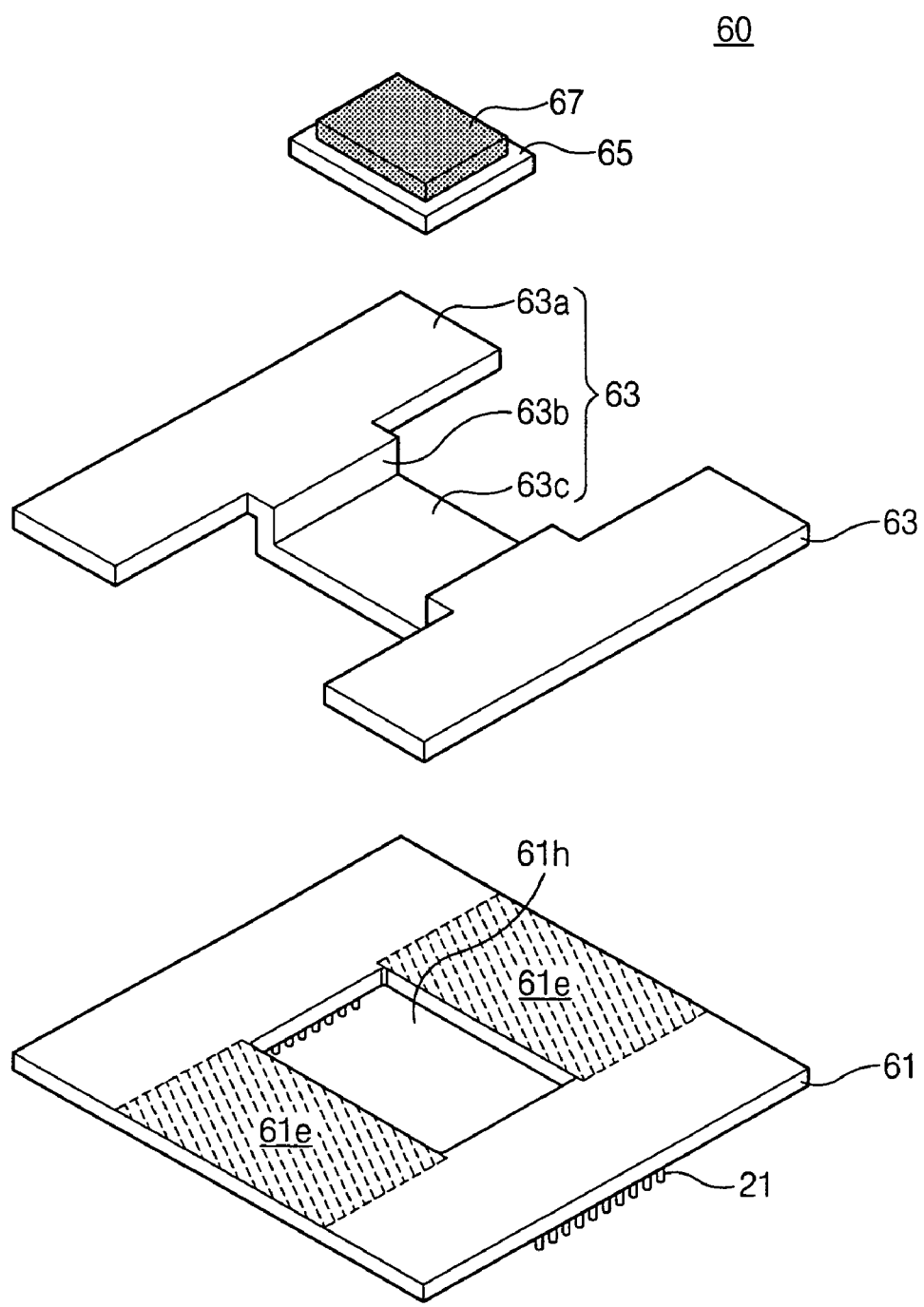
FIG. 6 is an exploded perspective view of a semiconductor package in accordance with a second embodiment of the present invention.

FIG. 6 is an exploded perspective view of a semiconductor package 60 in accordance with a second embodiment of the present invention. As shown, the semiconductor package 60 of the second embodiment includes a rectangular shaped circuit board 61 having a rectangular shaped first opening 61h, a metal structure 63, and a semiconductor chip 65. The circuit board 61 and the semiconductor chip 65 of the second embodiment are similar to the first embodiment.

The metal structure 63 of the second embodiment includes an upper horizontal metal member 63a, sidewall metal members 63b, and a lower horizontal metal member 63c. The lower horizontal metal member 63c and the sidewall metal members 63b may have substantially the same structure as the first embodiment. The upper horizontal metal member 63a is comprised of two plate shaped upper horizontal metal members 63a each connected to one of the two sidewall metal members 63b and spaced apart from each other. Member 63 has an overall "H" shape in plan view. In the first embodiment, the upper horizontal metal member 13a has a rectangular frame shape. In the second embodiment, a bonding region 61e exposed by the "H" shaped metal structure 63 has an area wider than that of the first embodiment. Therefore, it may be possible to more flexibly form electrical connections such as by wire bonding.

Embodiment 3

Figure 7:
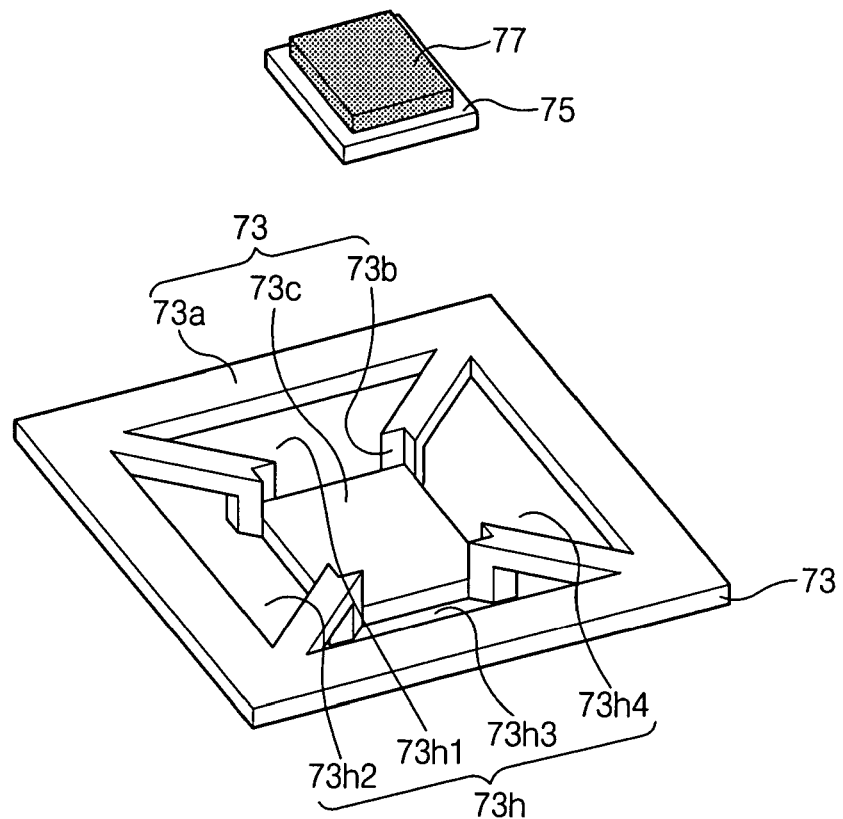
FIG. 7 is an exploded perspective view of a semiconductor package in accordance with a third embodiment of the present invention.
Figure 7:
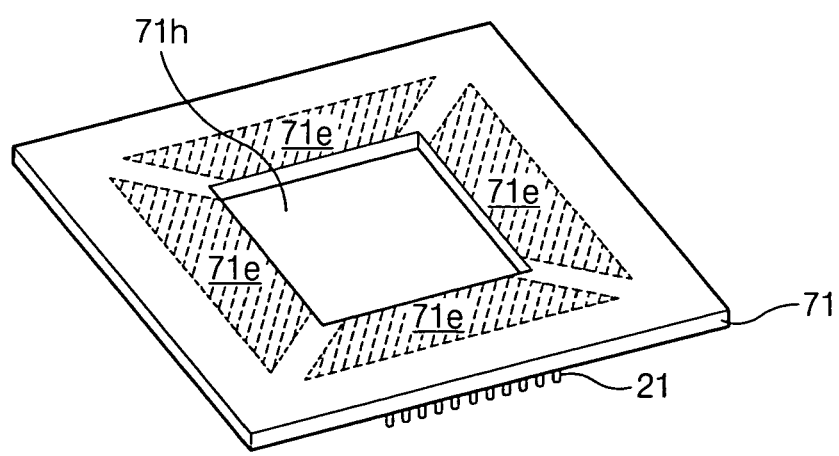

FIG. 7 is an exploded perspective view of a semiconductor package 70 in accordance with a third embodiment of the present invention. As shown, the semiconductor package 70 of the third embodiment includes a rectangular shaped circuit board 71 having a rectangular shaped first opening 71h, a metal structure 73, and a semiconductor chip 75. The circuit board 71 and the semiconductor chip 75 of the third embodiment may be similar to that of the first embodiment.

The metal structure 73 of the third embodiment includes an upper horizontal metal member 73a, sidewall metal members 73b, and a lower horizontal metal member 73c. The lower horizontal metal member 73c and the upper horizontal metal member 73a have the same structure as the first embodiment. The sidewall metal members 73b of the third embodiment differ in number and connecting method as compared to the first embodiment. That is, the sidewall metal members 73b of the third embodiment include four sidewall metal members 73b spaced apart from each other. The sidewall metal members 73b connect at four corners of an inner side of the rectangular frame shaped upper horizontal metal member 73a, e.g., four corners of the second opening 73h, and connect at four corners of the rectangular shaped lower horizontal metal member 73c. The sidewall metal members 73b thereby connect upper horizontal metal member 73a and the lower horizontal metal member 73c.

The second opening 73h of the upper horizontal metal member 73a of the metal structure 73 has a size larger than that of the first opening 71h. Therefore, when the metal structure 73 is mounted on the circuit board 71, as shown, portions of the circuit board adjacent to the four corners of the first opening 71h of the circuit board 71, i.e., the bonding region 71e, are exposed. The four bonding regions 71e of the circuit board 71 and the semiconductor chip 75 are electrically connected, e.g., through wire bonding. Therefore, it becomes possible to more flexibly perform the wire bonding.

The sidewall metal members 73b may vary in number or position, e.g., may connect opposite two corners at an inner side of the rectangular frame shaped upper horizontal metal member 73a and opposite two corners of the rectangular shaped lower horizontal metal member 73c to each other.

Embodiment 4

Figure 8:
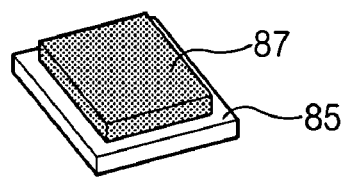
FIG. 8 is an exploded perspective view of a semiconductor package in accordance with a fourth embodiment of the present invention.
Figure 8:
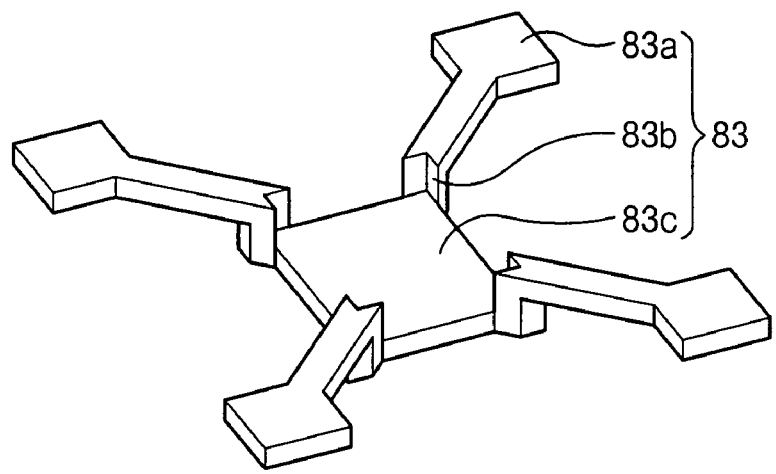
Figure 8:
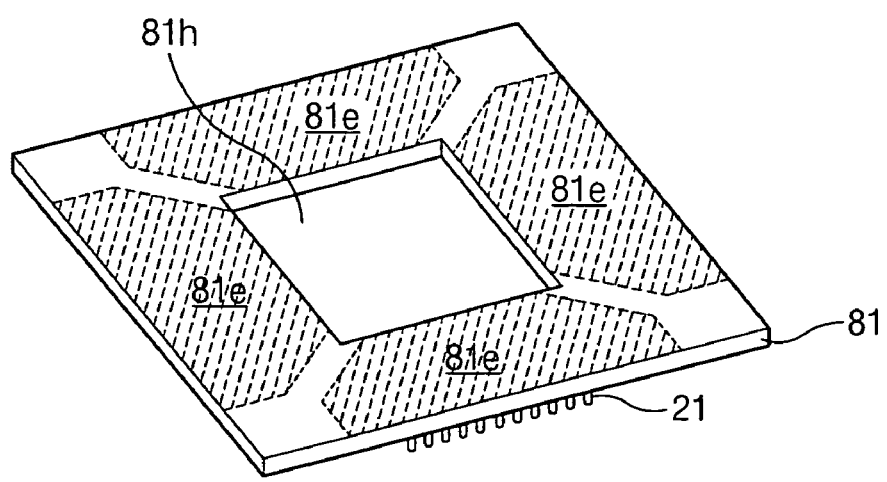

FIG. 8 is an exploded perspective view of a semiconductor package 80 in accordance with a fourth embodiment of the present invention. As shown, the semiconductor package 80 of the fourth embodiment includes a rectangular shaped circuit board 81 having a rectangular shaped first opening 81h, a metal structure 83, and a semiconductor chip 85. The circuit board 81 and the semiconductor chip 85 of the fourth embodiment may be similar to the first embodiment.

The metal structure 83 of the fourth embodiment includes an upper horizontal metal member 83a, sidewall metal members 83b, and a lower horizontal metal member 83c. The lower horizontal metal member 83c and the sidewall metal members 83b have the same structure as the third embodiment described in conjunction with FIG. 7. The upper horizontal metal member 83a of the fourth embodiment, however, is comprised of four upper horizontal metal members 83a spaced apart from each other and corresponding to the sidewall metal members 83b. That is, the sidewall metal members 83b extend from four corners of the rectangular shaped lower horizontal metal member 83c, and connect to the respective four upper horizontal metal members 83a. Therefore, when the metal structure 83 is mounted on the circuit board 81, as shown, bonding regions 81e of the circuit board adjacent to four sides of the first opening 81h of the circuit board 81 are exposed. Wire bonding is performed between the four bonding regions 81e of the circuit board and the semiconductor chip 85.

In accordance with the embodiments of the present invention, the lower horizontal metal member of the metal structure is in contact with the semiconductor chip and the upper horizontal metal member of the metal structure is in contact with the circuit board, thereby providing the semiconductor package with good thermal radiation characteristics.

In addition, the upper horizontal metal member of the metal structure stiffens the circuit board to provide the semiconductor package with excellent mechanical stability.

Further, since the circuit board is located under the metal structure, there is no need to form insertion holes for passing conductive pins through a metal structure, e.g., for electrical connection to another circuit board. As will be appreciated, various means for electrical connection to another circuit board, for example, conductive pins, solder balls, lands and so forth, may be used under embodiments of the present invention.

Furthermore, because the circuit board is formed of organic material, decreased package manufacturing cost results. Therefore, the wire pattern can be readily and inexpensively formed on organic material.

Although the present invention has been described in connection with embodiments of the present invention as illustrated in the accompanying drawings, it is not limited thereto. It will be apparent to those skilled in the art that various substitutions, modifications and changes may be made thereto without departing from the scope and spirit of the invention.

What is claimed is:

1. A semiconductor package comprising:
   a circuit board having an opening;
   a first region defined within a portion of the surface of the circuit board that is contiguous with an edge of the opening;
   a wire pattern formed within the first region;
   a metal structure including an upper metal member formed to cover a second region of the circuit board and expose the first region, a lower metal member coupled to the upper metal member and locatable relative to the opening, and sidewall metal members extending between the upper and lower metal members through the opening of the circuit board, wherein each of the sidewall metal members are spaced apart from one another; a semiconductor chip attached to the lower metal member; and
   a bonding wire extending over an edge of the lower metal member and electrically connecting the semiconductor chip to the wire pattern, wherein adjacent ones of the sidewall members are disposed at opposite sides of the bonding wire.

2. The semiconductor package as set forth in claim 1, wherein the circuit board comprises organic material.

3. The semiconductor package as set forth in claim 1, further comprising at least one of conductive pins, solder balls or lands electrically connected to the wire pattern of the circuit board.

4. The semiconductor package as set forth in claim 1, further comprising a hermetic sealing member to fill a space formed by the semiconductor chip, the sidewall metal members and the lower metal member of the metal structure, wherein the semiconductor chip has a plurality of mirrors on its surface.

5. The semiconductor package as set forth in claim 1, wherein the upper metal member has a rectangular frame shape having an opening to expose the opening of the circuit board;
   the lower metal member has a rectangular shape; and
   the sidewall metal members are comprised of two sidewall metal members spaced apart from each other and extending from an inner wall of the opening of the upper metal member to connect to two opposite sides of the rectangular shaped lower metal member.

6. The semiconductor package as set forth in claim 1, wherein the upper metal member has a rectangular frame shape having an opening to expose the opening of the circuit board;
   the lower metal member has a rectangular shape; and
   the sidewall metal members are comprised of at least two sidewall metal members spaced apart from each and other extending from an inner wall of the opening of the upper metal member to connect to at least two opposite corners of the rectangular shaped lower metal member.

7. The semiconductor package as set forth in claim 1, wherein the upper metal member comprises four metal members spaced apart from one another;
   the lower metal member has a rectangular shape; and
   the sidewall metal members are comprised of four sidewall metal members each extending from a corresponding one of the four upper metal members to connect to four corners of the rectangular shaped lower metal member, wherein each of the four sidewall metal members are spaced apart from each other.

8. The semiconductor package as set forth in claim 1, wherein the upper metal member comprises two metal members spaced apart from one another;

the lower metal member has a rectangular shape; and the sidewall metal members are comprised of two sidewall metal members spaced apart from each other and extending from respective ones of the two metal members of the upper metal member to connect to respective ones of two opposite sides of the rectangular shaped lower metal member.

9. A semiconductor package comprising:

a circuit board having a first opening;

a metal structure having an upper metal member attached to a first portion of the circuit board to expose a second portion of the circuit board, and having a projection insertable into the first opening of the circuit board, wherein the upper metal member includes side surfaces adjacent to the second portion of the circuit board;

a semiconductor chip attached to the projection; and a bonding wire electrically connected to the second portion of the circuit board, wherein the bonding wire extends directly from a location between portions of the protrusion to a location between the side surfaces of the upper metal member.

10. The semiconductor package as set forth in claim 9, wherein the projection comprises a lower metal member seated relative to the first opening, and sidewall metal members extending from the upper metal member into the first opening and connect to the lower metal member; the sidewall metal members and the lower metal member comprise the projection; and the semiconductor chip is attached to the lower metal member.

11. The semiconductor package as set forth in claim 9, wherein the circuit board comprises organic material.

12. The semiconductor package as set forth in claim 9, further comprising at least one of conductive pins, solder balls, or lands electrically connected to the wire pattern of the circuit board.

13. The semiconductor package as set forth in claim 9, further comprising a hermetic sealing member to fill a space formed by the semiconductor chip, the sidewall metal members and the lower metal member of the metal structure, and wherein the semiconductor chip has a plurality of mirrors on its surface.

14. The semiconductor package as set forth in claim 9, wherein the first opening of the circuit board and the lower metal member of the metal structure have a rectangular shape;

the upper metal member of the metal structure has a rectangular frame shape for defining a rectangular shaped second opening and is located on the circuit board to expose a portion of the circuit board adjacent to two opposite sides of the first opening; and the sidewall metal members of the metal structure extend from two opposite sides of the second opening to connect to two opposite sides of the rectangular shaped lower metal member.

15. The semiconductor package as set forth in claim 9, wherein the first opening of the circuit board and the lower metal member of the metal structure have a rectangular shape;

the upper metal member of the metal structure has a rectangular frame shape defining a rectangular shaped second opening locatable on the circuit board to expose a portion of the circuit board adjacent to four sides of the first opening; and the sidewall metal members of the metal structure extend from four corners of the second opening to be connected to four corners of the rectangular shaped lower metal member.

16. The semiconductor package as set forth in claim 9, wherein the first opening of the circuit board and the lower metal member of the metal structure have a rectangular shape;

the upper metal member of the metal structure has a rectangular frame shape for defining a rectangular shaped second opening locatable on the circuit board to expose a portion of the circuit board adjacent to four sides of the first opening; and the sidewall metal members of the metal structure extend from two corners of the second opening to connect to two corners of the rectangular shaped lower metal member.

17. The semiconductor package as set forth in claim 9, wherein the first opening of the circuit board and the lower metal member of the metal structure have a rectangular shape;

the upper metal member of the metal structure comprises four upper metal members to cover the circuit board adjacent to four corners of the first opening; and the sidewall metal member comprises four sidewall metal members extending from the spaced four upper metal members to connect to four corners of the lower metal member, wherein each of the four sidewall metal members are spaced apart from each other.

18. The semiconductor package as set forth in claim 9, wherein the first opening of the circuit board and the lower metal member of the metal structure have a rectangular shape;

the upper metal member of the metal structure comprises two upper metal members spaced apart from each other to cover the circuit board adjacent to two opposite sides of the first opening of the circuit board; and the sidewall metal members extend from the two upper metal members to connect to two opposite sides of the rectangular shaped lower metal member.

19. A semiconductor package comprising:

a rectangular frame shaped circuit board having a rectangular shaped opening;

a metal structure comprising a frame shaped upper metal member attachable to the circuit board to expose a first portion of the circuit board contiguous with an edge of the opening and to cover a second portion of the circuit board spaced apart from the edge of the opening by the first portion of the circuit board, a rectangular shaped lower metal member coupled to the frame shaped upper metal member and locatable relative to the opening, and sidewall members extending along first regions of a periphery of the lower metal member, wherein ends of the sidewall members are spaced apart from each other by a second region of the periphery along which no sidewall members extend and wherein the second region of the periphery of the lower metal member is adjacent to the first portion of the circuit board.

20. The semiconductor package as set forth in claim 19, wherein the upper metal member has a rectangular frame shape; and the sidewall members comprise two sidewall metal members spaced apart from each other to connect two opposite inner sides of the rectangular frame shaped upper metal member with two opposite sides of the lower metal member.

21. The semiconductor package as set forth in claim 19, wherein the upper metal member has a rectangular frame shape; and the sidewall members comprise at least two sidewall metal members spaced apart from each other to connect at least two corners of the rectangular frame shaped upper metal member with the at least two corners of the lower metal member.

22. A semiconductor package comprising:
a generally planar circuit board having a first side, a second side facing opposite the first side and an edge side connecting the first side and the second side;
a metal structure having a first generally planar surface and having a second generally planar surface opposite the first generally planar surface, the second generally planar surface coupled face-to-face with a first portion of the first side of the circuit board while leaving exposed a second portion of the first side of the circuit board contiguous with the edge side of the circuit board;
a semiconductor chip attached to the first generally planar surface of the metal structure and adjacent to the second portion of the first side of the circuit board for electrical connection thereto, wherein the metal structure is absent from a region defined between the semiconductor chip and the edge side of the circuit board; and
a bonding wire extending over the region and electrically connecting the semiconductor chip to the second portion of the first side of the circuit board.

23. A semiconductor package as set forth in claim 22, wherein the circuit board includes an opening and the metal structure includes a projection insertable into the opening, the projection comprising the first generally planar surface.

24. A semiconductor package as set forth in claim 22, wherein the first generally planar surface is rectangular.

25. A semiconductor package as set forth in claim 22, wherein the second generally planar surface comprises at least two surfaces spaced apart from each other.

26. A semiconductor package as set forth in claim 22, wherein the second generally planar surface comprises a continuous frame shaped surface.

27. The semiconductor package as set forth in claim 22, further comprising at least one of conductive pins, solder balls, and lands electrically connected to the circuit board and conductively accessible at the second side of the circuit board.

28. The semiconductor package as set forth in claim 22, wherein the circuit board comprises a bonding region at the second portion of the first side of the circuit board and the semiconductor is electrically connectable to the wiring pattern.

29. The semiconductor package as set forth in claim 1, wherein the semiconductor chip has a plurality of mirrors on its surface.

30. The semiconductor package as set forth in claim 19, further comprising:
a semiconductor chip attached to the lower metal member; and
a bond wire electrically connecting the first portion of the circuit board and the semiconductor chip,
wherein the bond wire extends over the second region of the periphery of the lower metal member.

31. A semiconductor package, comprising:
a circuit board including an opening and a wire pattern in a first region of a first surface of the circuit board, the wire pattern being adjacent to the opening of the circuit board;
a metal structure being configured to be insertable into the opening of the circuit board and mountable on a second region of the first surface of the circuit board to expose the wire pattern in the first region of the first surface of the circuit board;
a semiconductor chip attachable to the metal structure within the opening of the circuit board; and
a metal interconnection electrically connecting the semiconductor chip to the wire pattern.

32. The semiconductor package as set forth in claim 31, wherein the metal structure comprises a lower metal member locatable relative to the opening of the circuit board, an upper metal member mounted on the second region of the circuit board, and a sidewall member extending between the upper and lower metal members through the opening of the circuit board.

33. The semiconductor package as set forth in claim 32, wherein the metal interconnection is provided over the circuit board outside the upper metal member.

34. The semiconductor package as set forth in claim 32, wherein the sidewall metal member comprises a plurality of spaced apart sidewall metal members and a plurality of spaced apart upper metal members connected to respective ones of the plurality of spaced apart sidewall metal members.

35. The semiconductor package as set forth in claim 31, wherein the metal structure has an opening to expose the wire pattern in the first region of the circuit board.

36. The semiconductor package as set forth in claim 31, wherein the circuit board comprises an organic material.

37. The semiconductor package as set forth in claim 31, further comprising a conductive structure on a second surface of the circuit board, the first surface being opposite to the second surface.

38. The semiconductor package as set forth in claim 37, the conductive structure configured to electrically connect to an outer circuit board, the conductive structure comprising at least one selected from the group consisting of pins, solder balls, and lands.

39. A semiconductor package, comprising:
a circuit board including an opening and a wire pattern in a first region of the circuit board, the wire pattern being adjacent to the opening of the circuit board;
a metal structure being configured to be insertable into the opening of the circuit board and mountable on a second region of the circuit board to expose the wire pattern in the first region of the circuit board, the metal structure including a lower metal member locatable relative to the opening of the circuit board, an upper metal member mounted on the second region of the circuit board, and a sidewall member extending between the upper and lower metal members through the opening of the circuit board;
a semiconductor chip attachable to the metal structure within the opening of the circuit board; and
a metal interconnection electrically connecting the semiconductor chip to the wire pattern.

40. The semiconductor package as set forth in claim 39, wherein the metal interconnection is provided over the circuit board outside the upper metal member.

41. The semiconductor package as set forth in claim 39, wherein the sidewall metal member comprises a plurality of spaced apart sidewall metal members and a plurality of spaced apart upper metal members connected to respective ones of the plurality of spaced apart sidewall members.

42. A semiconductor package, comprising:
a circuit board including an opening and a wire pattern in a first region of the circuit board, the wire pattern being adjacent to the opening of the circuit board;
a metal structure being configured to be insertable into the opening of the circuit board and mountable on a second region of the circuit board to expose the wire pattern in the first region of the circuit board, the metal structure having an opening to expose the wire pattern in the first region of the circuit board;
a semiconductor chip attachable to the metal structure within the opening of the circuit board; and
a metal interconnection electrically connecting the semiconductor chip to the wire pattern.

43. A semiconductor package, comprising:
a circuit board including an opening and a wire pattern in a first region of the circuit board, the wire pattern being adjacent to the opening of the circuit board, the circuit board including an organic material;
a metal structure being configured to be insertable into the opening of the circuit board and mountable on a second region of the circuit board to expose the wire pattern in the first region of the circuit board;
a semiconductor chip attachable to the metal structure within the opening of the circuit board; and
a metal interconnection electrically connecting the semiconductor chip to the wire pattern.

* * * * *